United States Patent
Tsao et al.

(10) Patent No.: US 10,506,712 B1
(45) Date of Patent: Dec. 10, 2019

(54) PRINTED CIRCUIT BOARD

(71) Applicant: Taiwan Semiconductor Manufacturing Co., Ltd., Hsinchu (TW)

(72) Inventors: Pei-Haw Tsao, Tai-chung (TW); Tsung-Hsing Lu, Jhubei Dity (TW); Li-Huan Chu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/051,127

(22) Filed: Jul. 31, 2018

(51) Int. Cl.
*H05K 1/02* (2006.01)
*H05K 1/03* (2006.01)
*H05K 1/05* (2006.01)
*H01L 23/31* (2006.01)
*H01B 3/08* (2006.01)
*H05K 1/11* (2006.01)

(52) U.S. Cl.
CPC ............. *H05K 1/056* (2013.01); *H01B 3/084* (2013.01); *H01L 23/3114* (2013.01); *H05K 1/032* (2013.01); *H05K 1/036* (2013.01); *H05K 1/0313* (2013.01); *H05K 1/0353* (2013.01); *H05K 1/11* (2013.01); *H05K 1/0284* (2013.01); *H05K 1/0366* (2013.01); *H05K 1/0373* (2013.01); *H05K 2201/0275* (2013.01)

(58) Field of Classification Search
CPC .............. H05K 1/056; H05K 1/032; H05K 2201/0275; H01B 3/084; H01L 23/3114
See application file for complete search history.

(56) References Cited

U.S. PATENT DOCUMENTS

| | | | |
|---|---|---|---|
| 6,323,435 B1 * | 11/2001 | Strandberg | H01L 21/481 174/255 |
| 7,071,424 B1 * | 7/2006 | Shirai | H05K 3/421 174/263 |
| 9,859,201 B2 * | 1/2018 | Shimizu | H01L 23/49838 |
| 2016/0088741 A1 * | 3/2016 | Van Den Bersselaar | H05K 1/03 174/251 |
| 2016/0381792 A1 * | 12/2016 | Mok | H05K 1/0271 174/251 |

* cited by examiner

*Primary Examiner* — Ishwarbhai B Patel
(74) *Attorney, Agent, or Firm* — Seed IP Law Group LLP (57) ABSTRACT

Generally, the present disclosure provides example embodiments relating to a printed circuit board (PCB). In an embodiment, a structure includes a PCB including insulating layers with respective metal layers being disposed therebetween. Each of first layers of the insulating layers includes a first fiberglass content. A second layer of the insulating layers has a second fiberglass content less than the first fiberglass content. For example, in some embodiments, the second insulating layer does not include a fiberglass matrix.

19 Claims, 8 Drawing Sheets

PRINTED CIRCUIT BOARD

BACKGROUND

In the electronics industry, generally, integrated circuits are formed on semiconductor dies. The features of the integrated circuits on the semiconductor dies are becoming progressively smaller with advances in semiconductor processing. Semiconductor dies (with integrated circuits) are commonly packaged in packages that contain an interconnect. The interconnect of the package can be formed as an integral part of the package or can be formed independently of other components of the package (such as a package substrate). The interconnect in the package generally provides an interface between the integrated circuit of the semiconductor die and another component.

Packages, and possibly other surface mount devices, can then be attached to a printed circuit board (PCB). The PCB can be a substrate to which any number of components are attached to form a system-level device, for example.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to a printed circuit board (PCB). The PCB includes a number of insulating layers and metal layers disposed between neighboring pairs of insulating layers. Some of the insulating layers each include a fiberglass matrix that can provide structural strength to the PCB, while other insulating layers do not include a fiberglass matrix, which can permit forming smaller width and smaller pitch metal lines in metal layers formed on those insulating layers. In some examples, an insulating layer having a fiberglass matrix (e.g., a layer of pre-preg) can have a relatively large surface roughness. The large surface roughness can prevent downscaling of pitches of metal lines because the large surface roughness can prevent full removal (e.g., by etching) of a metal (e.g., from a metal foil) on the insulating layer to form the metal lines. The large surface roughness can prevent downscaling of widths of the metal lines because the large surface roughness can cause defects in the metal line such that larger widths may be implemented to ensure continuity of the metal line. An insulating layer that does not have a fiberglass matrix may not have these challenges, and hence, pitches and widths of metal lines may be smaller on an insulating layer that does not have a fiberglass matrix. The smaller width and smaller pitch metal lines can increase the density of metal lines in the PCB, which can increase the number of signals that can be routed through the PCB. Other benefits may be achieved.

Some variations of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

Figure 1:
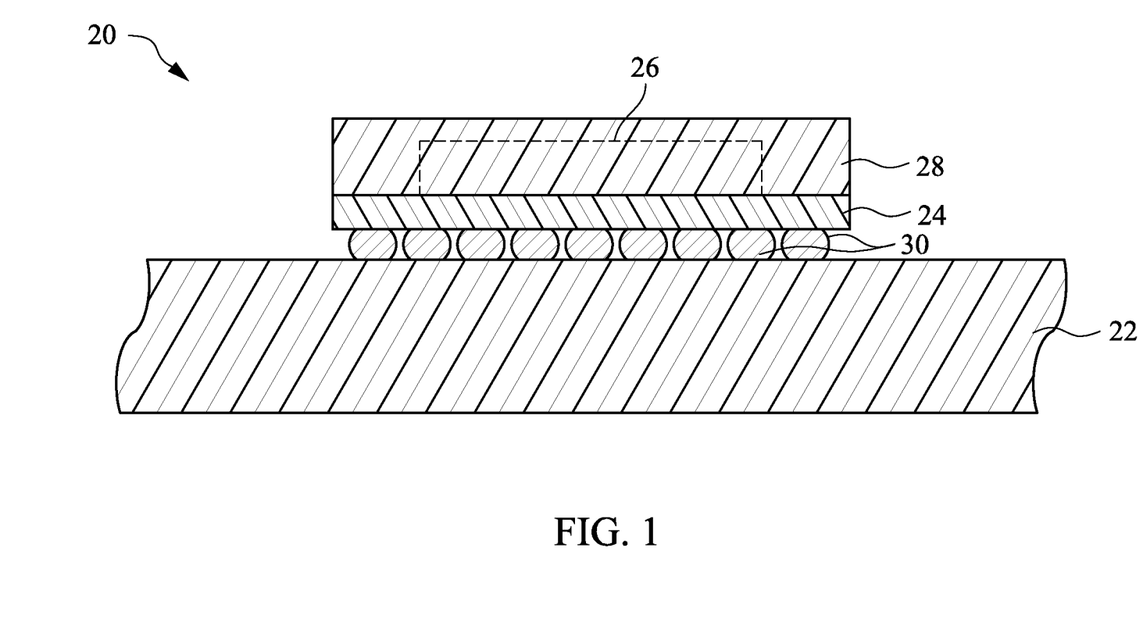
FIG. 1 is a cross-sectional view of a package mechanically attached and electrically coupled to a printed circuit board (PCB) in accordance with some embodiments.

FIG. 1 illustrates a cross-sectional view of a package 20 mechanically attached and electrically coupled to a PCB 22 in accordance with some embodiments. The package 20 includes a package substrate 24 and one or more dies 26 on the package substrate 24. The one or more dies 26 are encapsulated on the package substrate 24 by an encapsulant 28, such as a molding compound.

The package 20 can be any package. As illustrated, the package 20 includes a package substrate 24, but such a package substrate can be omitted in other examples, such as when the package has in integrated interconnect like in an integrated fan-out package. The one or more dies 26, which can include any appropriate integrated circuitry, can be mechanically attached and electrically coupled to the package substrate 24 by any suitable technique. For example, the one or more dies 26 can be mechanically attached and electrically coupled to the package substrate 24 using flip chip technology. Controlled collapse chip connects (C4) can be implemented on the one or more dies 26 and can be used to attach the one or more dies 26 to the package substrate 24. In another example, the one or more dies 26 can be mechanically attached to the package substrate 24 by an adhesive and can be electrically coupled to the package substrate 24 by wire bonding. Any other technology can be used to mechanically attach and electrically couple the one or more dies 26 to the package substrate 24. If more than one die 26 is included in the package 20, any combination of technologies, e.g., flip chip, wire bonding, etc., can be implemented to mechanically attach and electrically couple the dies 26 to the package substrate 24.

After the one or more dies 26 are mechanically attached and electrically coupled to the package substrate 24, the one or more dies 26 are encapsulated on the package substrate 24. In some examples, the one or more dies 26 are encapsulated by an encapsulant 28, such as by a molding compound using compression molding, transfer molding, or another molding process.

The package substrate 24 includes a number of metal layers that include vias and lines that route interconnections. The package substrate 24 can redistribute and/or interconnect various signals and/or components through the vias and/or lines of the metal layers. Additional details of example package substrates are described below.

The package 20 is mechanically attached and electrically coupled to the PCB 22 by solder balls 30. The solder balls 30 are or include a lead-free solder, such as tin, silver, copper (Sn—Ag—Cu or SAC) solder, or another solder. Solder can be formed on pads of the package substrate 24, such as by printing, plating, evaporation, or another process. The package 20 can be placed on the PCB 22 such that the solder aligns with respective pads on the PCB 22, and a reflow process can be performed to reflow the solder thereby forming the solder balls 30 that attach the package 20 to the PCB 22. Multiple packages can be mechanically attached and electrically coupled to the PCB 22.

The PCB 22 includes multiple metal layers that each includes lines, which may be interconnected between layers by through-hole connectors. The PCB 22 can redistribute and/or interconnect various signals and/or components through the through-hole connectors and/or lines. The PCB 22 with various packages attached thereto may implement a system or portion thereof. Additional details of example PCBs are described below.

Figure 2:
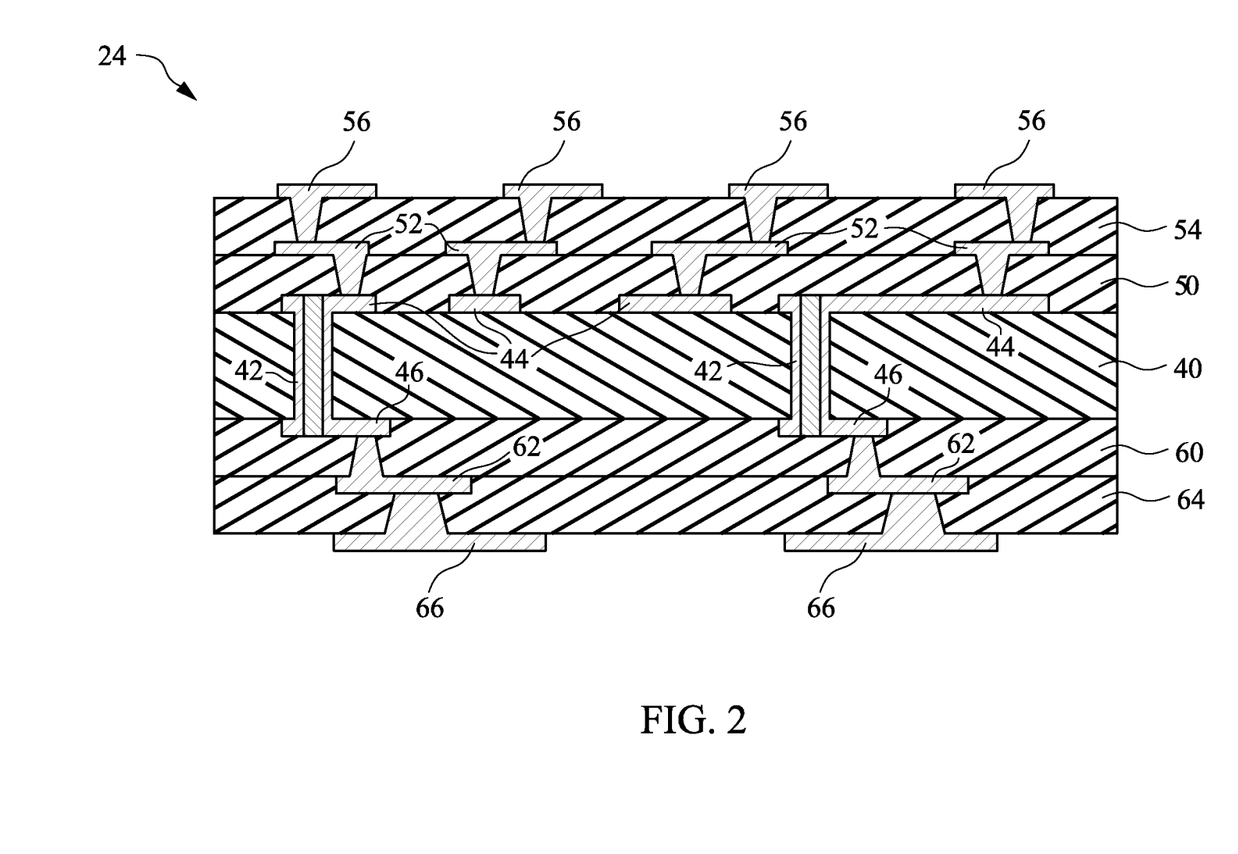
FIG. 2 is a cross-sectional view of a portion of the package substrate in accordance with some embodiments.

FIG. 2 illustrates a cross-sectional view of a portion of the package substrate 24. The package substrate 24 includes a core 40. The core 40 provides mechanical strength and rigidity for the package substrate 24. The core 40, in some embodiments, is or includes a layer of pre-preg (e.g., a fiberglass matrix injected with an epoxy resin, such as FR-4). The layer of pre-preg can have a metal foil (e.g., copper foil) on opposing sides. Through-holes can be formed through the layer of pre-preg and plated with a metal (e.g., copper) to form through-hole connectors 42. The metal foil on the opposing sides can be etched using photolithography and etch processes to form metal lines on the opposing sides. Hence, the core 40 can include through-hole connectors 42 electrically coupled to various metal lines 44, 46 on opposing sides of the core 40.

Various levels of insulating layers and metal layers are then formed on the core 40. For convenience, "front-side" is used herein to designate the side of the core 40 on which the one or more dies 26 are to be attached, and "back-side" is used herein to designate the side of the core 40 opposite from the front-side.

As illustrated, a first front-side insulating layer 50 is formed on the core 40 and metal lines 44. The first front-side insulating layer 50, in some examples, is an Ajinomoto Build-up Film (ABF) or the like, and is coated (e.g., by lamination or another process) on the core 40 and metal lines 44. Via openings are formed through the first front-side insulating layer 50 to underlying metal lines 44 using laser drilling, for example. A metal seed layer is formed on the first front-side insulating layer 50, such as by using physical vapor deposition (PVD), and a photoresist is formed and patterned over the metal seed layer. A plating process (such as electroless or electroplating) is performed to form metal lines 52 and vias (not individually numbered) to connect the metal lines 52 with the underlying metal lines 44. The photoresist is then removed, such as by using a wet stripping process, and the exposed metal seed layer is removed, such as by a wet etching process. The metal seed layer can be or include copper, titanium, another metal, or a combination thereof, and the metal lines 52 and vias can be or include copper, another metal, or a combination thereof. A second front-side insulating layer 54 and die-connection pads 56 with vias are formed on the first front-side insulating layer 50 and metal lines 52. The second front-side insulating layer 54 and die-connection pads 56 with vias can be formed using the same processes as described with respect to the first front-side insulating layer 50 and metal lines 52 with vias. The die-connection pads 56 can be configured and arranged according to how the one or more dies 26 are to be attached to the package substrate 24. For example, the die-connection pads 56 can be configured and arranged to accommodate flip chip connections, wire bonding, or other connections.

A first back-side insulating layer 60 is formed on the core 40 and metal lines 46. Metal lines 62 and vias (not individually numbered) are formed to connect the metal lines 62 with the underlying metal lines 46. The first back-side insulating layer 60 and metal line 62 with vias can be formed using the same processes as described with respect to the first front-side insulating layer 50 and metal lines 52 with vias. A second back-side insulating layer 64 and ball pads 66 with vias are formed on the first back-side insulating layer 60 and metal lines 62. The second back-side insulating layer 64 and ball pads 66 with vias can be formed using the same processes as described with respect to the first front-side insulating layer 50 and metal lines 52 with vias. The ball pads 66 can be configured and arranged according to a ball grid array (BGA) matrix, for example, on which the solder balls 30 can be formed.

The one or more dies 26 can be attached to the package substrate 24 at various times of forming the package substrate 24. For example, the one or more dies 26 can be attached (such as by flip chip connections, wire bonding, etc.) on the front-side of the package substrate 24 after back-side processing (e.g., forming back-side insulating layers 60, 64, metal lines 62, and ball pads 66) is performed. In other examples, the one or more dies 26 can be attached on the front-side of the package substrate 24 before back-side processing is performed. In such examples, the one or more dies 26 can be attached on the front-side of the package substrate 24 and encapsulated by the encapsulant 28 (such as described above) before back-side processing is performed.

The package substrate 24 is merely an example. Any number of insulating layers and metal layers including metal lines and vias can be formed on the front-side and/or the back-side of the core. In some examples, package substrates can omit a core and any associated components. A package substrate can be formed by any process according to any technology.

Figure 3:
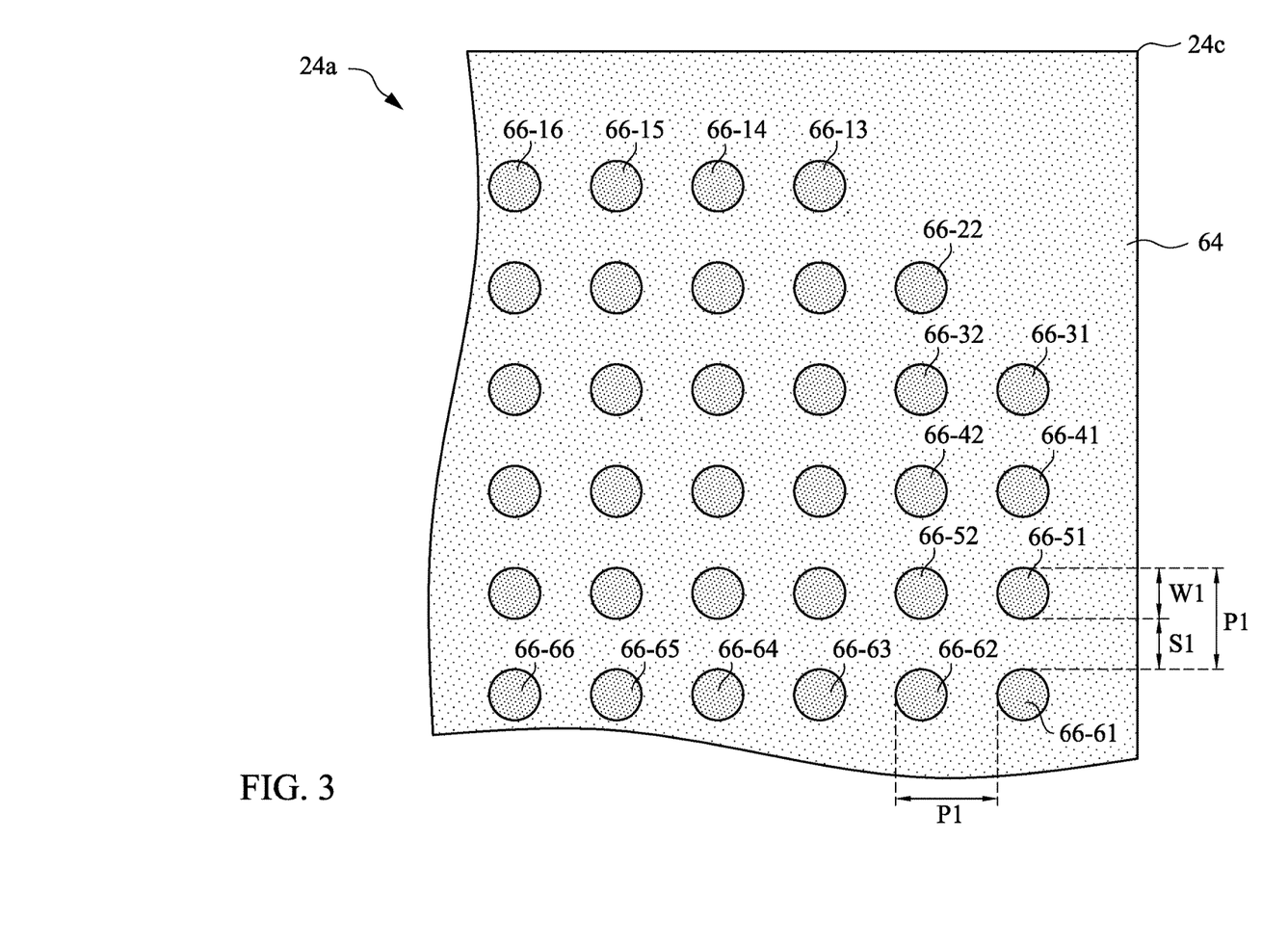
FIG. 3 is a layout view of a corner portion of the package substrate in accordance with some embodiments.

FIG. 3 illustrates a layout view of a corner portion 24a of the package substrate 24 in accordance with some embodiments. In some examples, a layout of the package substrate 24 is rectangular, such as a square or rectangle. In such examples, the corner portion 24a is representative of each of the four corners in the layout of the package substrate 24. In the layout, ball pads 66 are arranged in an array. As illustrated, the corner portion 24a is depopulated of ball pads 66 proximate the corner 24c. For example, FIG. 3 illustrates two row depopulation, although in other examples, one row depopulation or three or more rows depopulation may be implemented. In other examples, no depopulation may be present, and the outer rows and columns of the array may form a rectangular shape. Further, although not necessarily illustrated, the array can include ball pads 66 throughout the area of the array, or can omit ball pads in some locations, such as in a center area of the layout of the package substrate 24.

As illustrated, the array includes rows (as referenced herein, x number of rows) of ball pads 66, where a first row includes ball pads 66-1j, a second row includes ball pads 66-2j, a third row includes ball pads 66-3j, etc. (where j is 1 to y as appropriate). The array includes columns (as referenced herein, y number of columns) of ball pads 66, where a first column includes ball pads 66-i1, a second column includes ball pads 66-i2, a third column includes ball pads 66-i3, etc. (where i is 1 to x as appropriate). A first pitch P1 between neighboring ball pads 66 along a row or along a column can be in a range from about 200 µm to about 1000 µm, such as about 1000 µm. As illustrated in FIG. 3, the first pitch P1 is between ball pads 66-51 and 66-61 in a column, and is between ball pads 66-61 and 66-62 in a row. The ball pads 66 have a first width W1 (e.g., diameter), and have a first spacing S1 between neighboring ball pads 66 along a row or along a column. The first width W1 plus the first spacing S1 is equal to the first pitch P1. The first width W1 can be in a range from about 100 µm to about 600 µm, such as about 600 µm, and the first spacing S1 can be in a range from about 100 µm to about 400 µm, such as about 400 µm. Although illustrated as circular, the ball pads 66 can have any geometry, such as any polygon.

Figure 4:
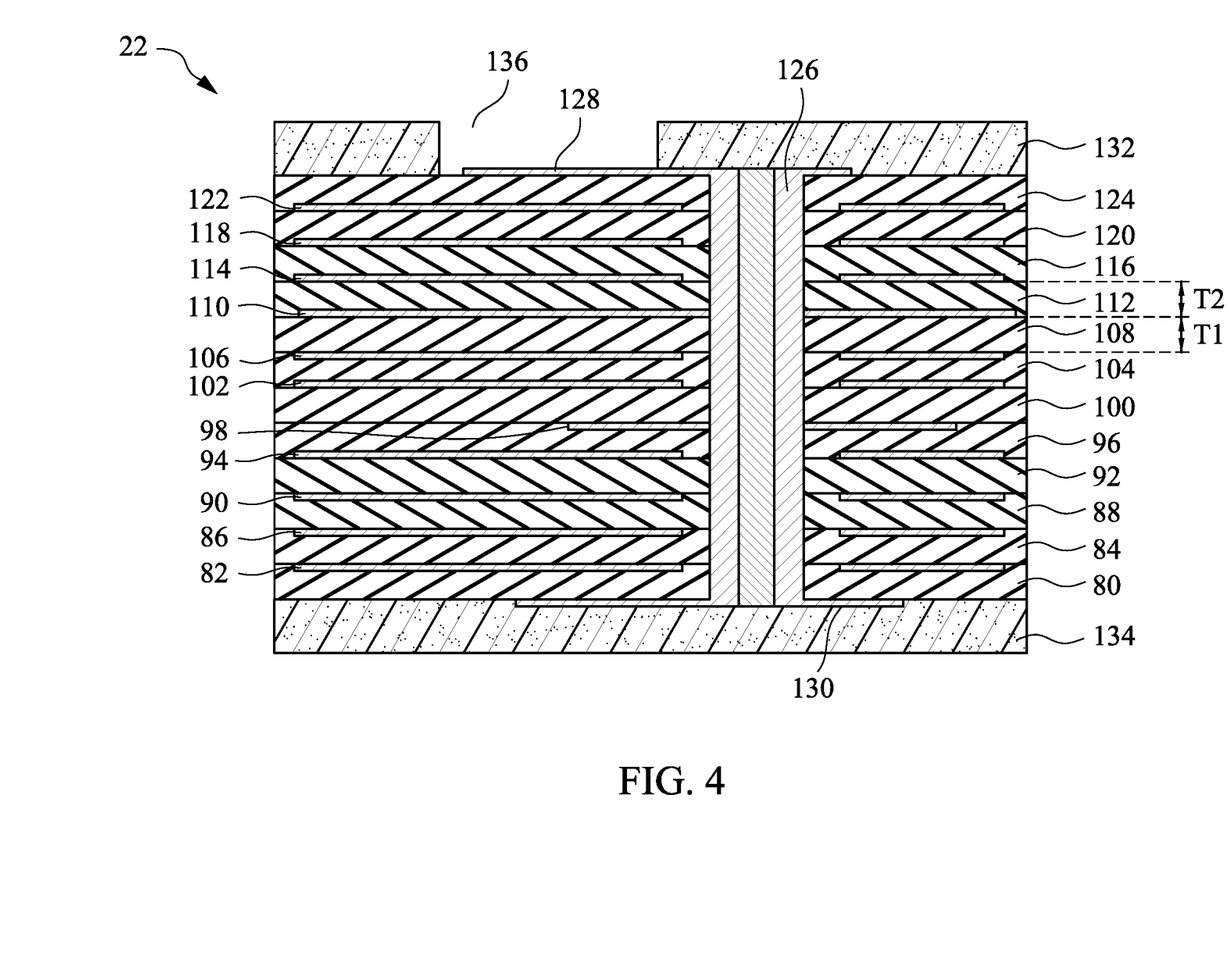
FIG. 4 is a cross-sectional view of a portion of the PCB in accordance with some embodiments.

FIG. 4 illustrates a cross-sectional view of a portion of the PCB 22 in accordance with some embodiments. The PCB 22 includes a number of insulating layers 80, 84, 88, 92, 96, 100, 104, 108, 112, 116, 120, and 124 and a number of metal layers. The various metal layers as illustrated include metal lines 82, 86, 90, 94, 98, 102, 106, 110, 114, 118, and 122. In some examples, the PCB 22 includes ten to thirty different insulating layers with a metal layer disposed between each neighboring pair of insulating layers.

In some examples, some of the insulating layers include a fiberglass matrix while others of the insulating layers do not include a fiberglass matrix or have a fiberglass content that is less than the insulating layers that include a fiberglass matrix. The insulating layers that include the fiberglass matrix can provide mechanical strength to the PCB 22, while the insulating layers that do not include a fiberglass matrix can permit fine pitch metal lines being formed on those insulating layers. For illustration purposes, specific insulating layers are described below and illustrated in the figures as including or not including a fiberglass matrix; however, in various examples, any number and/or combination of layers can include or not include a fiberglass matrix.

As illustrated in FIG. 4, each of the insulating layers 80, 84, 96, 100, 104, 108, 120, and 124 of the PCB 22 is or includes a fiberglass matrix. For example, each of the insulating layers 80, 84, 96, 100, 104, 108, 120, and 124 is or includes a layer of pre-preg (e.g., a fiberglass matrix injected with an epoxy resin, such as FR-4). Further, each of the insulating layers 88, 92, 112, and 116 of the PCB 22 does not include a fiberglass matrix. For example, each of the insulating layers 88, 92, 112, and 116 is or includes a resin layer, such as an Ajinomoto Build-up Film (ABF) or the like, which may further include or not include a filler material, such as silica, or the like.

When the insulating layers 80, 84, 96, 100, 104, 108, 120, and 124 are pre-preg, each layer of pre-preg can initially have a metal foil (e.g., copper foil) on one or both opposing sides. Each metal foil is patterned into the corresponding metal lines 82, 94, 98, 102, 106, 110, and 122 using photolithography and etch processes. After the metal foils are patterned to form corresponding metal lines, some of the pre-preg layers (that will not have an intervening layer without a fiberglass matrix) are joined together. Those pre-preg layers are aligned and pressed together to bond the insulating layers. In the illustrated example, the insulating layers 96, 100, 104, 108, with corresponding metal lines 94, 98, 102, 106, and 110 formed thereon, are joined together.

After joining those pre-preg layers, a resin layer is formed on a side of the joined pre-preg layers. The resin layer is coated on the side of the joined pre-preg layers. Via openings can formed through the resin layer to underlying metal lines using laser drilling, for example. A metal seed layer is formed on the resin layer, such as by using electroless plating or the like, and a photoresist is formed and patterned over the metal seed layer. A plating process (such as electroless or electroplating) is performed to form metal lines, and possibly, vias where via openings are formed to connect the metal lines with the underlying metal lines. The photoresist is then removed, such as by using a wet stripping process, and the exposed metal seed layer is removed, such as by a wet etching process. The metal seed layer can be or include copper, titanium, another metal, or a combination thereof, and the metal lines and vias can be or include copper, another metal, or a combination thereof. This processing can be repeated for subsequently formed resin layers and associated metal lines and vias.

After forming the resin layer and associated metal lines and, possibly, vias, one or more pre-preg layers with patterned metal lines can be joined to the outer resin layer, which is formed on previously joined pre-preg layers. The one or more pre-preg layers are aligned and pressed together on the outer resin layer to bond the insulating layers. This processing can be repeated any number of times to produce a PCB with any configuration of pre-preg and resin layers.

To continue the example in the illustration of FIG. 4, the insulating layer 112 is coated on the insulating layer 108 and metal lines 110. Metal lines 114 with or without vias through the insulating layer 112 are formed using a seed layer, photolithography, and plating, such as described previously. Then, the insulating layer 116 is coated on the insulating layer 112 and metal lines 114, and metal lines 118 with or without vias through the insulating layer 116 are formed. Then, the insulating layers 120 and 124, with corresponding metal lines 122 formed thereon, are aligned with the insulating layers 96, 100, 104, 108, 112, and 116 and are pressed to join the insulating layers 96, 100, 104, 108, 112, 116, 120, and 124 together.

Then, the insulating layer 92 is coated on the insulating layer 96 and metal lines 94. Metal lines 90 with or without vias through the insulating layer 92 are formed. Then, the insulating layer 88 is coated on the insulating layer 92 and metal lines 90, and metal lines 86 with or without vias through the insulating layer 88 are formed. Then, the insulating layers 80 and 84, with corresponding metal lines 82 formed thereon, are aligned with the insulating layers 88, 92, 96, 100, 104, 108, 112, 116, 120, and 124 and are pressed to join the insulating layers 80, 84, 88, 92, 96, 100, 104, 108, 112, 116, 120, and 124 together.

In some examples, a thickness of each insulating layer with a fiberglass matrix is larger than a thickness of each insulating layer without a fiberglass matrix. For example, in FIG. 4, the insulating layer 108 (with a fiberglass matrix) has a first thickness T1, and the insulating layer 112 (without a fiberglass matrix) has a second thickness T2. In some examples, the first thickness T1 is greater than the second thickness T2. In some examples, the first thickness T1 is in a range from about 100 μm to about 200 μm, and the second thickness T2 is in a range from about 10 μm to about 100 μm.

After the insulating layers are joined, through-hole connectors 126 are formed through the insulating layers. Holes can be formed through the joined insulating layers using drilling, for example. After forming the holes, the joined insulating layers may be plated with a metal (e.g., copper and/or tin). The plating forms the through-hole connectors 126 in the holes and can also form a metal layer on the exterior surfaces of the joined insulating layers. The metal layers on the exterior surfaces are patterned. On an exterior surface, ball pads 128 with metal lines connecting the ball pads 128 to the through-hole connectors 126 are patterned. On another exterior surface, metal lines 130 or other patterns are patterned. The patterning of the ball pads 128 with metal lines and/or the metal lines 130 on the exterior surfaces can be implemented by photolithography and etching processes, and/or a photolithography process and the plating that deposits the metal.

Solder masks (or solder resists) 132 and 134 are formed on respective exterior surfaces of the joined insulating layers. The solder masks 132 and 134 can be patterned to expose an underlying metal pattern. For example, as illustrated, the solder mask 132 is patterned, using a photolithography process, to define openings 136 that expose the ball pads 128.

Figure 5:
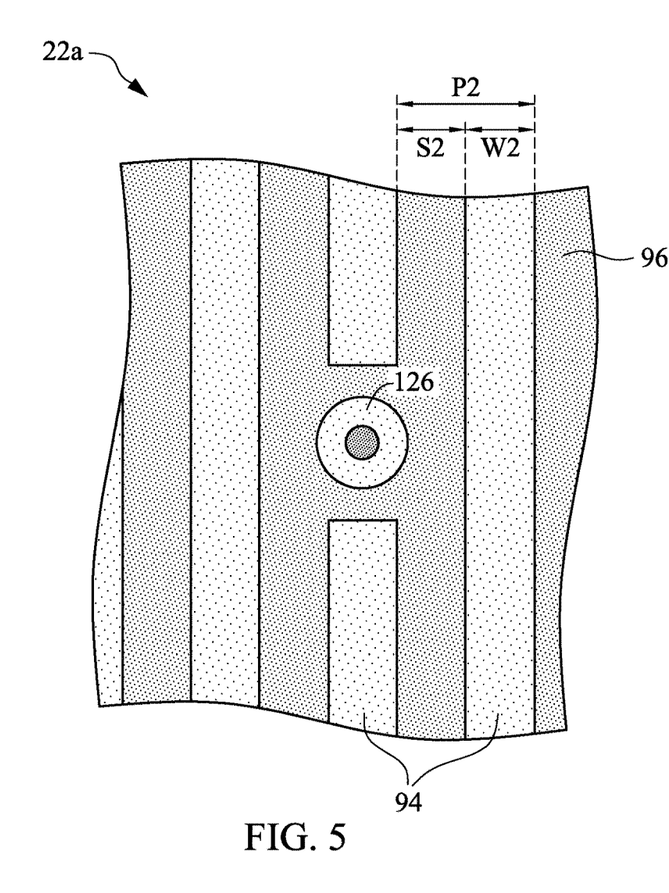
FIGS. 5, 6, and 7 are layout views of respective portions of the PCB in accordance with some embodiments.

FIG. 5 illustrates a layout view of a portion 22a of the PCB 22 in accordance with some embodiments. The layout view is an example of a layout view of an insulating layer with a fiberglass matrix, e.g., a layer of pre-preg. FIG. 5 illustrates the insulating layer 96 with metal lines 94 thereon as an example. Each metal line 94 has a minimum second width W2. Neighboring metal lines 94 have a minimum second spacing S2 and a minimum second pitch P2.

Figure 6:
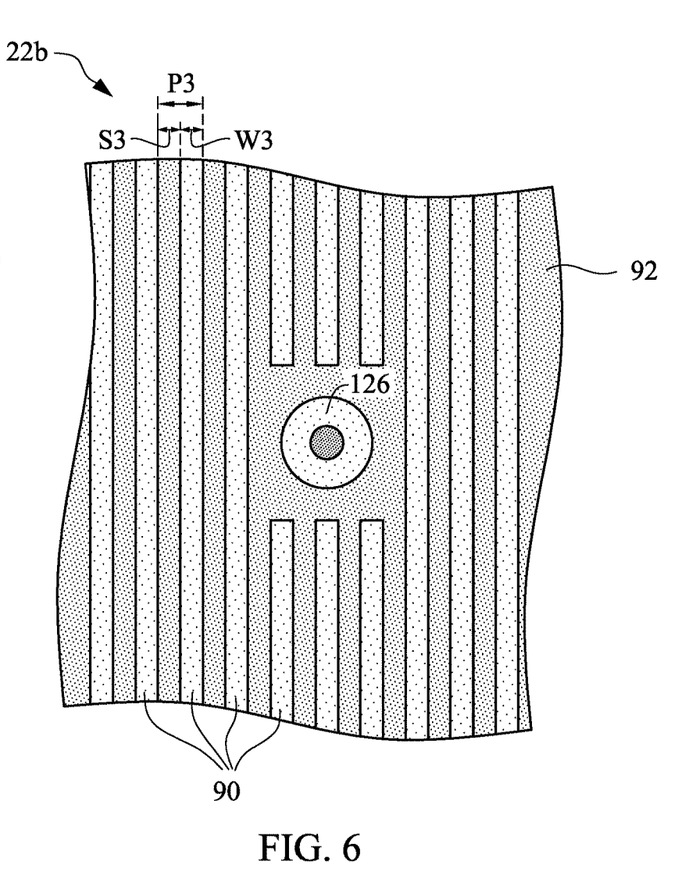

FIG. 6 illustrates a layout view of a portion 22b of the PCB 22 in accordance with some embodiments. The layout view is an example of a layout view of an insulating layer 92 without a fiberglass matrix, e.g., a resin layer. FIG. 6 illustrates the insulating layer 92 with metal lines 90 thereon as an example. Each metal line 90 has a third width W3. Neighboring metal lines 90 have a third spacing S3 and a third pitch P3.

Insulating layers that include a fiberglass matrix can have a surface roughness that is greater than insulating layers that do not include a fiberglass matrix. For example, surface roughness of a layer of pre-preg can be in a range from about 1 μm RMS to about 10 μm RMS, while surface roughness of a layer of ABF can be in a range from about 0.05 μm RMS to about 0.5 μm RMS. The surface roughness of an insulating layer with a fiberglass matrix can be prohibitive for scaling pitches and widths of metal lines formed on the insulating layer. To help ensure continuity and proper electrical flow of a metal line on an insulating layer with a fiberglass matrix, the minimum width (e.g., the minimum second width W2) of the metal line is relatively large due to the surface roughness of the insulating layer, which can cause defects in the metal line. Similarly, due to the surface roughness of the insulating layer with a fiberglass matrix, etching of metal can be more difficult to fully remove the metal from some locations, and hence, the minimum spacing (e.g., the minimum second spacing S2) between metal lines is relatively large to help ensure that sufficient metal is removed to prevent shorting between metal lines.

Conversely, the surface roughness of an insulating layer that does not include a fiberglass matrix may not create these same challenges in forming metal lines on the insulating layer. Hence, metal lines formed on an insulating layer that does not include a fiberglass matrix can have a smaller width and spacing between neighboring metal lines. In the illustrations of FIGS. 5 and 6, the minimum second width W2 is about 25 μm, whereas the third width W3 can be about 20 μm or less (e.g., about 10 μm or less) (or greater than 20 μm in some implementations), such as in a range from about 10 μm to about 20 μm. Similarly, the minimum second spacing S2 is about 25 μm, whereas the third spacing S3 can be about 20 μm or less (e.g., about 10 μm or less) (or greater than 20 μm in some implementations), such as in a range from about 10 μm to about 20 μm. Hence, density of metal lines on the insulating layers that do not include a fiberglass matrix can be increased.

In some examples, insulating layers with a fiberglass matrix are implemented as the outermost insulating layers (e.g., insulating layers 80 and 124) of the PCB 22. By having the outermost insulating layers include respective fiberglass matrices, mechanical strength can be provided at outer portions of the PCB 22. For example, the insulating layers can provide more mechanical strength for pads that attach to solder balls. An insulating layer with a fiberglass matrix can have a low coefficient of thermal expansion (CTE). The low CTE can reduce stress on solder balls that are attached to packages. Hence, solder ball joint reliability risks can be minimized.

In some examples, insulating layers without a fiberglass matrix can compose up to half of the insulating layers in the PCB 22. For example, if the PCB 22 includes ten insulating layers, five of the insulating layer can include a fiberglass matrix, while up to five of the insulating layers can omit a fiberglass matrix. Similarly, for example, if the PCB 22 includes thirty insulating layers, fifteen of the insulating layer can include a fiberglass matrix, while up to fifteen of the insulating layers can omit a fiberglass matrix. In other examples, the insulating layers without a fiberglass matrix can compose any number of the insulating layers in the PCB 22.

Figure 7:
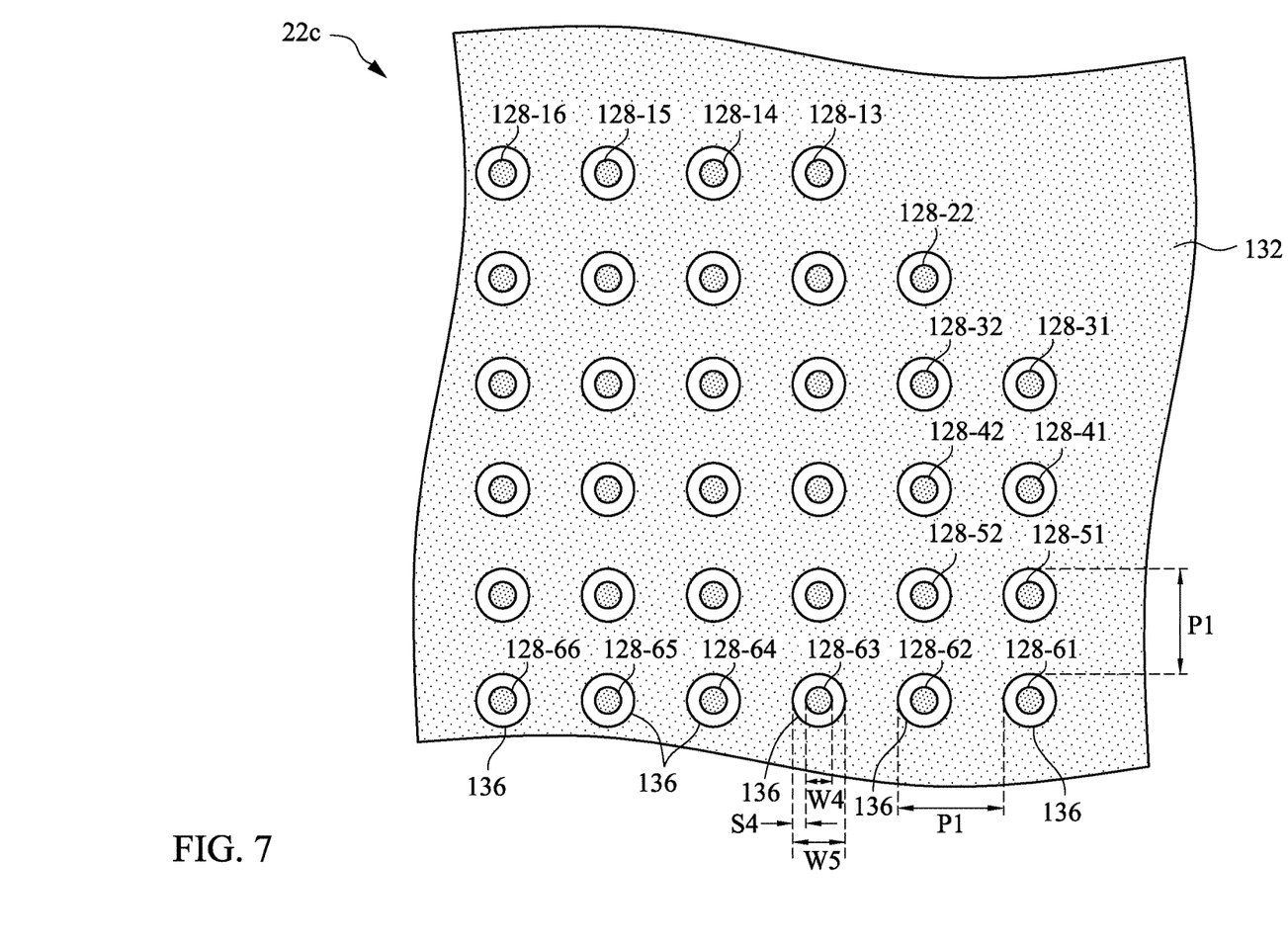

FIG. 7 illustrates a layout view of a portion 22c of the PCB 22 in accordance with some embodiments. In the layout, ball pads 128 are arranged in an array comprising rows (as referenced herein, x number of rows) and columns (as referenced herein, y number of columns). The array of ball pads 128 corresponds to the array of ball pads 66 on the package substrate 24. As illustrated, corner portions corresponding to the package 20 are depopulated of ball pads 128. For example, FIG. 7 illustrates two row depopulation, although in other examples, one row depopulation or three or more rows depopulation may be implemented. In other examples, no depopulation may be present, and the outer rows and columns of the array may form a rectangular shape. Further, although not necessarily illustrated, the array can include ball pads 128 throughout the area of the array, or can omit ball pads in some locations, such as in a center area of the layout of the array.

As illustrated, the array includes rows of ball pads 128, where a first row includes ball pads 128-1*j*, a second row includes ball pads 128-2*j*, a third row includes ball pads 128-3*j*, etc. (where j is 1 to y as appropriate). The array includes columns of ball pads 128, where a first column includes ball pads 128-*i*1, a second column includes ball pads 128-*i*2, a third column includes ball pads 128-*i*3, etc. (where i is 1 to x as appropriate). Each ball pad 128 is exposed through a respective opening 136 through the solder mask 132. The first pitch P1 is between neighboring ball pads 128 and/or openings 136 along a row or along a column.

The ball pads 128 have a fourth width W4 (e.g., diameter). The openings 136 have a fifth width W5 (e.g., diameter). The fifth width W5 is greater than the fourth width W4. In some examples, the fourth width W4 is in a range from about 90 μm to about 550 μm, such as about 500 μm, and the fifth width W5 is in a range from about 150 μm to about 600 μm, such as about 575 μm. Although illustrated as circular, the ball pads 128 and openings 136 can have any geometry, such as any polygon.

Gaps are defined between the edges of ball pads 128 and respective sidewalls of the openings 136. The gaps have a fourth spacing S4 between the edge of the ball pad 128 and the sidewall of the opening 136. In some examples, the fourth spacing S4 is in a range from about 25 μm to about 60 μm, such as about 30 μm. In other examples, the openings 136 can have varying diameters, and/or the spacing of gaps formed in the openings 136 can be equal or vary throughout the array.

As illustrated and described the ball pads 128 are non-solder mask defined pads. The openings 136, as illustrated, are larger than the areas of the ball pads 128, which form the gaps between the edges of the ball pads 128 and the sidewalls of the opening 136. In other examples, the ball pads may be solder mask defined pads. In these examples, the openings 136 define the areas of the ball pads on which the solder balls are to be formed.

Figure 8:
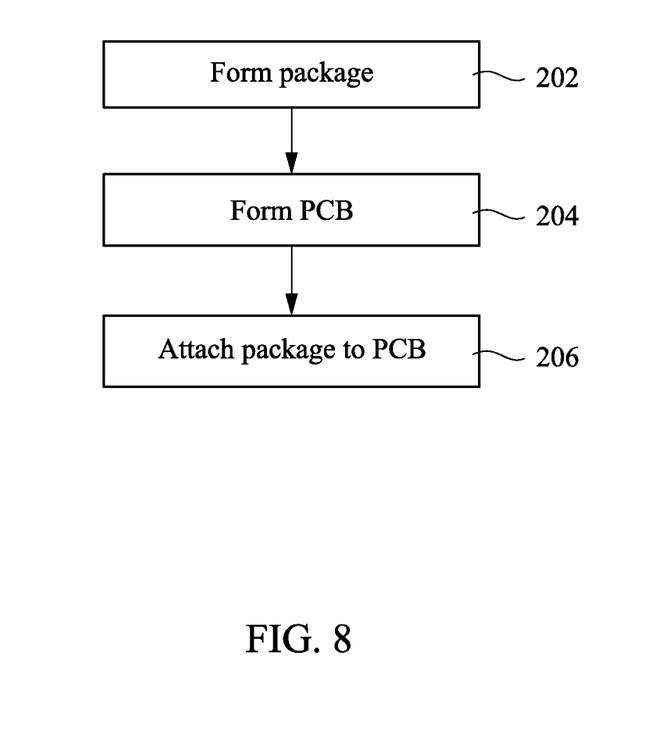
FIG. 8 is a flow chart for forming a package attached to a PCB in accordance with some embodiments.

FIG. 8 is a flow chart for forming a package attached to a PCB in accordance with some embodiments. In operation 202, a package is formed, such as to be described subsequently with reference to FIG. 9. In operation 204, a PCB is formed, such as to be described subsequently with reference to FIG. 10. In operation 206, the package is attached to the PCB. For example, solder can be formed on ball pads on the package and/or the PCB. The package can be placed on the PCB and aligned such that the ball pads on the package aligns with appropriate ball pads on the PCB with the solder disposed therebetween. The solder is then reflowed to form a more permanent mechanical and electrical attachment between the ball pads of the package and the ball pads of the PCB.

Figure 9:
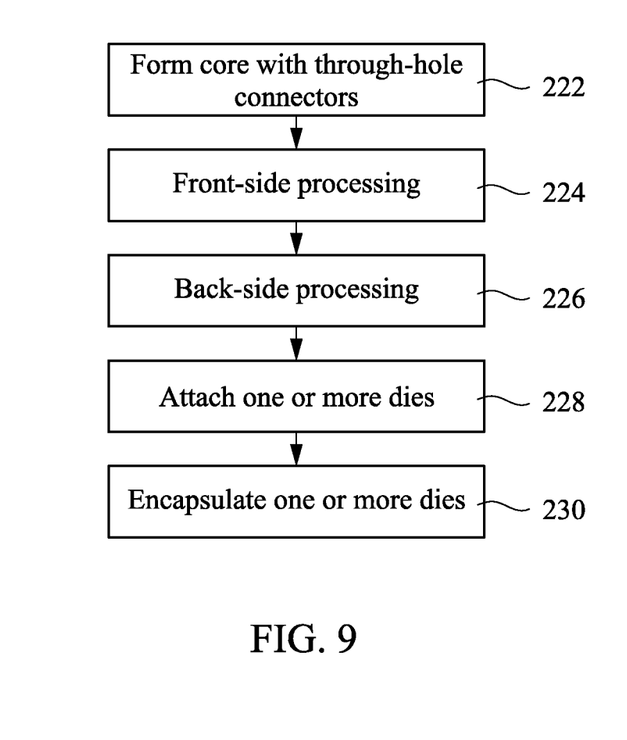
FIG. 9 is a flow chart for forming a package in accordance with some embodiments.

FIG. 9 is a flow chart for forming a package in accordance with some embodiments. In operation 222, a core is formed with through-hole connectors. The core can be formed as described above with respect to FIG. 2. In operation 224, front-side processing is performed to form one or more insulating layers with one or more metal layers on the front-side of the core. Any number of insulating layers and metal layers may be formed on the front-side as described above with respect to FIG. 2. In operation 226, back-side processing is performed to form one or more insulating layers with one or more metal layers on the back-side of the core. Any number of insulating layers and metal layers may be formed on the back-side as described above with respect to FIG. 2. The insulating layers on the front-side and back-side, the metal layers disposed in the insulating layers, and the core form a package substrate. In operation 228, one or more dies are attached to the front-side of the package substrate, such as described above with respect to FIG. 2. In operation 230, the one or more dies are encapsulated on the front-side of the package substrate. For example, an encapsulant, such as a molding compound, may be used to encapsulate the one or more dies, such as by using compression molding, transfer molding, or another molding process.

Figure 10:
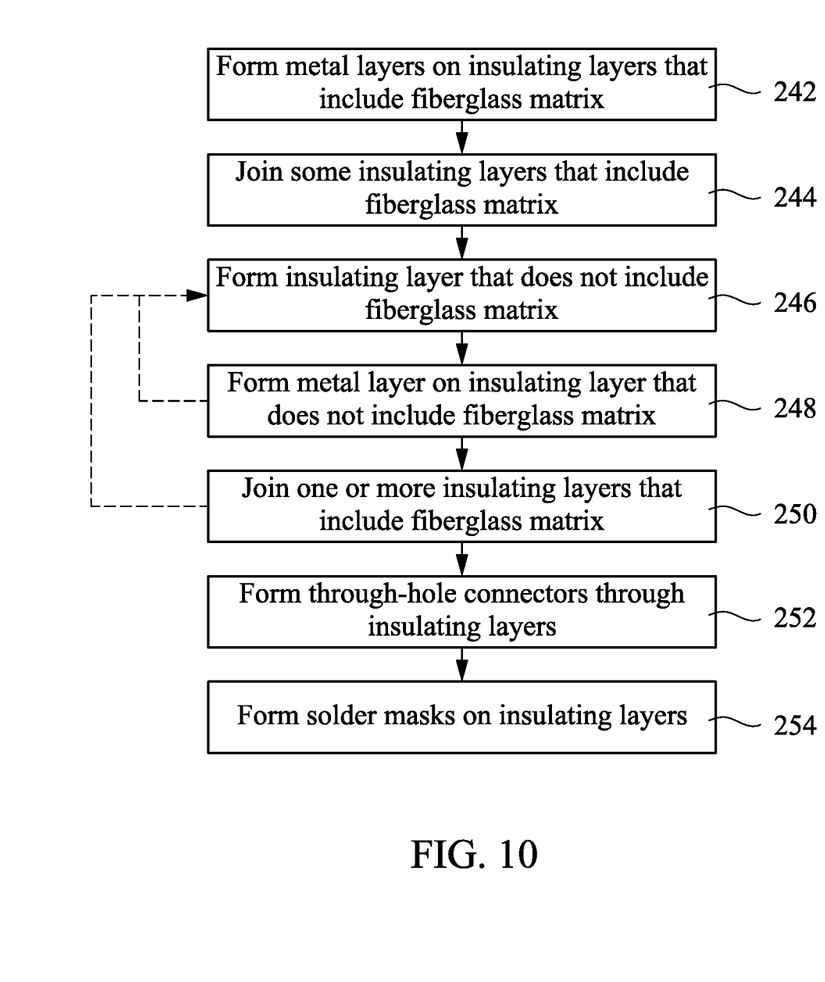
FIG. 10 is a flow chart for forming a PCB in accordance with some embodiments.

FIG. 10 is a flow chart for forming a PCB in accordance with some embodiments. In operation 242, metal layers are formed on insulating layers that include a fiberglass matrix. The metal layers (e.g., with patterned metal lines) can be formed on the insulating layers that include a fiberglass matrix as described above with respect to FIG. 4, e.g., for insulating layers 80, 84, 96, 100, 104, 108, 120, and 124 and corresponding metal lines 82, 94, 98, 102, 106, 110, and 122.

In operation 244, some of the insulating layers that include a fiberglass matrix (with the metal layers) can be joined together, such as described above with respect to FIG. 4, e.g., for the insulating layers 96, 100, 104, and 108, with corresponding metal lines 94 98, 102, 106, and 110. In operation 246, an insulating layer that does not include a fiberglass matrix is formed, in a first instance of operation 246, on an insulating layer that does include a fiberglass matrix, such as described above with respect to FIG. 4, e.g., for the insulating layer 112. In operation 248, a metal layer is formed on the insulating layer that does not include a fiberglass matrix, such as described above with respect to FIG. 4, e.g., for the metal lines 114 on the insulating layer 112. Operations 246 and 248 may thereafter be repeated to sequentially form an additional one or more insulating layers without a fiberglass matrix and metal layer on the previously formed insulating layer without a fiberglass matrix, such as described above with respect to FIG. 4, e.g., for the insulating layer 116 and metal lines 118.

In operation 250, one or more insulating layers that include a fiberglass matrix (with the metal layers) are joined together to the outer insulating layer that does not include a fiberglass matrix, such as described above with respect to FIG. 4, e.g., for the insulating layers 120 and 124 with corresponding metal lines 122. Thereafter, operations 246, 248, and 250 may be repeated (with operations 246 and 248 potentially being repeated a number of times within a repetition of operations 246, 248, and 250). In the context of FIG. 4, operations 246 and 248 are repeated to form the insulating layers 92 and 88 and metal lines 90 and 86, and operation 250 is repeated to join insulating layers 84 and 80. These operations may be repeated any number of times to form a PCB with any configuration.

In operation 252, through-hole connectors are formed through the joined insulating layers, such as described above with respect to FIG. 4. The forming of the through-hole connectors may further form metal layers on exterior surfaces of the joined insulating layers. In operation 254, solder masks are formed on the exterior surfaces and are patterned to expose ball pads.

Some embodiments can achieve advantages. As described, some examples can enable smaller pitch and smaller width metal lines in a PCB. The smaller pitches and smaller width metal lines can permit a higher density of routing in a PCB. The higher density can permit more signals (e.g., input/output signals) to be carried through the PCB. Additionally, some examples can be implemented with sufficient mechanical strength for a PCB. Solder joint reliability issues can be minimized by implementing layers with a fiberglass matrix as described.

An embodiment is a structure. The structure includes a printed circuit board (PCB) including insulating layers with respective metal layers being disposed therebetween. Each of first layers of the insulating layers includes a first fiberglass content. A second layer of the insulating layers has a second fiberglass content less than the first fiberglass content.

Another embodiment is a structure. The structure includes a printed circuit board (PCB). The PCB include a first outer insulating layer including a first fiberglass matrix, a first inner insulating layer free of a fiberglass matrix, and a second outer insulating layer including a second fiberglass matrix. The first inner insulating layer is disposed between the first outer insulating layer and the second outer insulating layer.

A further embodiment is a method. The method includes forming a printed circuit board (PCB). Forming the PCB includes coating a second insulating layer on a first insulating layer and on a first metal layer; after coating the second insulating layer, depositing a second metal layer on the second insulating layer; and joining a third insulating layer on the second insulating layer and the second metal layer. The first insulating layer includes fiberglass. The first metal layer is on the first insulating layer. The second insulating layer is a resin layer free of fiberglass. The third insulating layer includes fiberglass.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
 a printed circuit board (PCB) comprising insulating layers with respective metal layers being disposed therebetween, wherein:
 each of first layers of the insulating layers includes a first fiberglass content, one of the first layers on another of the first layers without an intervening insulating layer between the one of the first layers and the another of the first layers,
 a second layer of the insulating layers has a second fiberglass content less than the first fiberglass content, the second layer of the insulating layers is on one of the first layers of the insulating layers, and
 another of a first layer of the insulating layers is over the second layer of the insulating layers.

2. The structure of claim 1, wherein the second fiberglass content is substantially zero.

3. The structure of claim 1, wherein the second layer of the insulating layers is a resin layer.

4. The structure of claim 1, wherein the second layer of the insulating layers is an Ajinomoto Build-up Film (ABF).

5. The structure of claim 1, wherein the second layer of the insulating layers includes a filler material.

6. The structure of claim 1, wherein the second layer of the insulating layers is free of a filler material.

7. The structure of claim 1, wherein each of the first layers of the insulating layers is a layer of pre-preg.

8. The structure of claim 1, wherein a first metal layer of the metal layers is disposed on a layer of the first layers of the insulating layers, and a second metal layer of the metal layers is disposed on the second layer of the insulating layers, a first pitch of metal lines in the first metal layer is greater than a second pitch of metal lines in the second metal layer.

9. The structure of claim 1, wherein a first metal layer of the metal layers is disposed on a layer of the first layers of the insulating layers, and a second metal layer of the metal layers is disposed on the second layer of the insulating layers, a first width of a metal line in the first metal layer is greater than a second width of a metal line in the second metal layer.

10. The structure of claim 1, wherein:
 a first metal layer of the metal layers is disposed on the second layer of the insulating layers;
 a width of a metal line in the first metal layer is equal to or less than 10 μm; and
 a spacing between neighboring metal lines in the first metal layer is equal to or less than 10 μm.

11. The structure of claim 1, wherein outermost layers of the insulating layers each include a fiberglass matrix, the second layer of the insulating layers being disposed between the outermost layers of the insulating layers.

12. The structure of claim 1, wherein the second layer of the insulating layer has a surface roughness of about 0.05 μm RMS to about 0.5 μm RMS.

13. The structure of claim 1, wherein up to one-half of the insulating layers comprise the second layers.

14. A structure comprising:
 a printed circuit board (PCB) comprising:
 a plurality of first outer insulating layers, each of the plurality of first outer insulating layers including a first fiberglass matrix, one of the plurality of first outer insulating layers directly on another of the plurality of first outer insulating layers; and
 at least one of a first inner insulating layer free of a fiberglass matrix on one of the plurality of first outer insulating layers,
 wherein up to one-half of the combined number of first outer insulating layers and at least one first inner insulating layer comprise the first outer insulating layers.

15. The structure of claim 14, further comprising:
 a second outer insulating layer including a second fiberglass matrix, the at least one of a first inner insulating layer disposed between the plurality of first outer insulating layers and the second outer insulating layer; and
 a second inner insulating layer including a third fiberglass matrix, the second inner insulating layer being disposed between the plurality of first outer insulating layers and the second outer insulating layer.

16. The structure of claim 15, wherein:
 a first metal layer comprising first metal lines is on the at least one of a first inner insulating layer, a first spacing being between the first metal lines;
 a second metal layer comprising second metal lines is on the second inner insulating layer, a second spacing being between the second metal lines; and
 the first spacing is smaller than the second spacing.

17. The structure of claim 16, wherein the first spacing is 10 μm or less.

18. The structure of claim 15, wherein:
 a first outer insulating layer is a first layer of pre-preg;

a first inner insulating layer is a layer of Ajinomoto Build-up Film (ABF); and the second outer insulating layer is a second layer of pre-preg.

19. The structure of claim 14 further comprising:

a package comprising one or more dies; and solder balls attached to the package and to the PCB.

* * * * *

UNITED STATES PATENT AND TRADEMARK OFFICE
CERTIFICATE OF CORRECTION

PATENT NO. : 10,506,712 B1
APPLICATION NO. : 16/051127
DATED : December 10, 2019
INVENTOR(S) : Pei-Haw Tsao et al.

Page 1 of 1

It is certified that error appears in the above-identified patent and that said Letters Patent is hereby corrected as shown below:

In the Claims

Column 12, Claim 12, Line 28:
"the insulating layer"
Should be:
--the insulating layers--.

Signed and Sealed this
Fourteenth Day of July, 2020

Andrei Iancu
*Director of the United States Patent and Trademark Office*